United States Patent
Karr

(10) Patent No.: US 10,013,235 B2
(45) Date of Patent: Jul. 3, 2018

(54) METHOD AND SYSTEM FOR QUEUING DATA FOR MULTIPLE READERS AND WRITERS

(71) Applicant: Travelport, LP, Atlanta, GA (US)

(72) Inventor: Bryan Karr, Fort Collins, CO (US)

(73) Assignee: TRAVELPORT, LP, Atlanta, GA (US)

( * ) Notice: Subject to any disclaimer, the term of this patent is extended or adjusted under 35 U.S.C. 154(b) by 0 days.

(21) Appl. No.: 14/786,080

(22) PCT Filed: Jun. 13, 2014

(86) PCT No.: PCT/US2014/042390
§ 371 (c)(1),
(2) Date: Oct. 21, 2015

(87) PCT Pub. No.: WO2014/201408
PCT Pub. Date: Dec. 18, 2014

(65) Prior Publication Data
US 2016/0070535 A1    Mar. 10, 2016

Related U.S. Application Data

(60) Provisional application No. 61/834,682, filed on Jun. 13, 2013.

(51) Int. Cl.
| | |
|---|---|
| *G06F 12/00* | (2006.01) |
| *G06F 5/14* | (2006.01) |
| *G06F 9/50* | (2006.01) |
| *G06F 9/54* | (2006.01) |
| *G06F 13/16* | (2006.01) |
| *G11C 21/00* | (2006.01) |

(52) U.S. Cl.
CPC .............. *G06F 5/14* (2013.01); *G06F 9/5016* (2013.01); *G06F 9/5022* (2013.01); *G06F 9/544* (2013.01); *G06F 13/1673* (2013.01); *G11C 21/00* (2013.01); *G06F 2205/063* (2013.01)

(58) Field of Classification Search
None
See application file for complete search history.

(56) References Cited

U.S. PATENT DOCUMENTS

2004/0052135 A1    3/2004  Le
2005/0289254 A1*  12/2005  Chien ..................... G06F 13/28
                                              710/52
2007/0143326 A1    6/2007  Chase et al.
(Continued)

OTHER PUBLICATIONS

International Search Report and Written Opinion of the International Searching Authority for International Application No. PCT/US14/42390 dated Oct. 20, 2014.
(Continued)

*Primary Examiner* — Baboucarr Faal
(74) *Attorney, Agent, or Firm* — K&L Gates LLP

(57) ABSTRACT

Systems and methods of queuing data for multiple readers and writers are provided. Enqueuing operations are disclosed that can process write functionality and can determine whether ring buffers have potentially filled, and dynamically declare a new ring buffer at a multiple of capacity of the current ring. Dequeuing operations are disclosed that can process read functionality for advancing control and determining whether and when to free ring buffers from memory.

14 Claims, 13 Drawing Sheets

(56) References Cited

U.S. PATENT DOCUMENTS

2009/0150465 A1 6/2009 Branda et al.
2012/0066192 A1 3/2012 Hepkin et al.

OTHER PUBLICATIONS

Examination Report of the Intellectual Property Office of the United Kingdom for Application No. GB1421649.3 dated Jan. 16, 2015.

* cited by examiner

| | | ITEM 1<br>230<br>POSITION =<br>1001<br>232 | ITEM 2<br>POSITION =<br>1002 | ITEM 3<br>POSITION =<br>1003 | • • • |
|---|---|---|---|---|---|
| 240 — next<br>241 — front<br>242 — padding 1<br>243 — back<br>244 — end<br>248 — padding 2<br>250 — capacity<br>252 — mask | • • • | | | | |
| 210 | 212 | 214 | 216 | 218 | 220 |

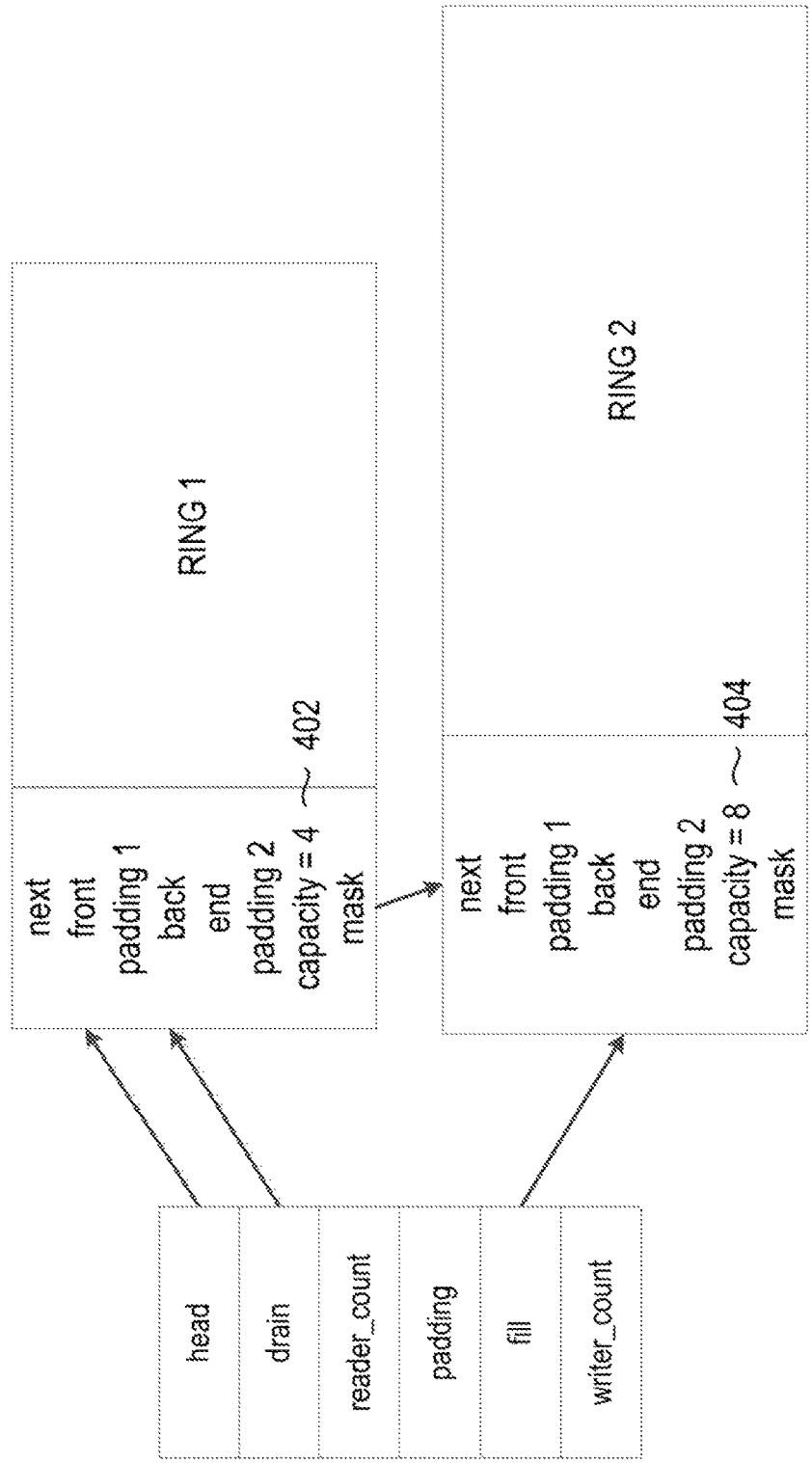

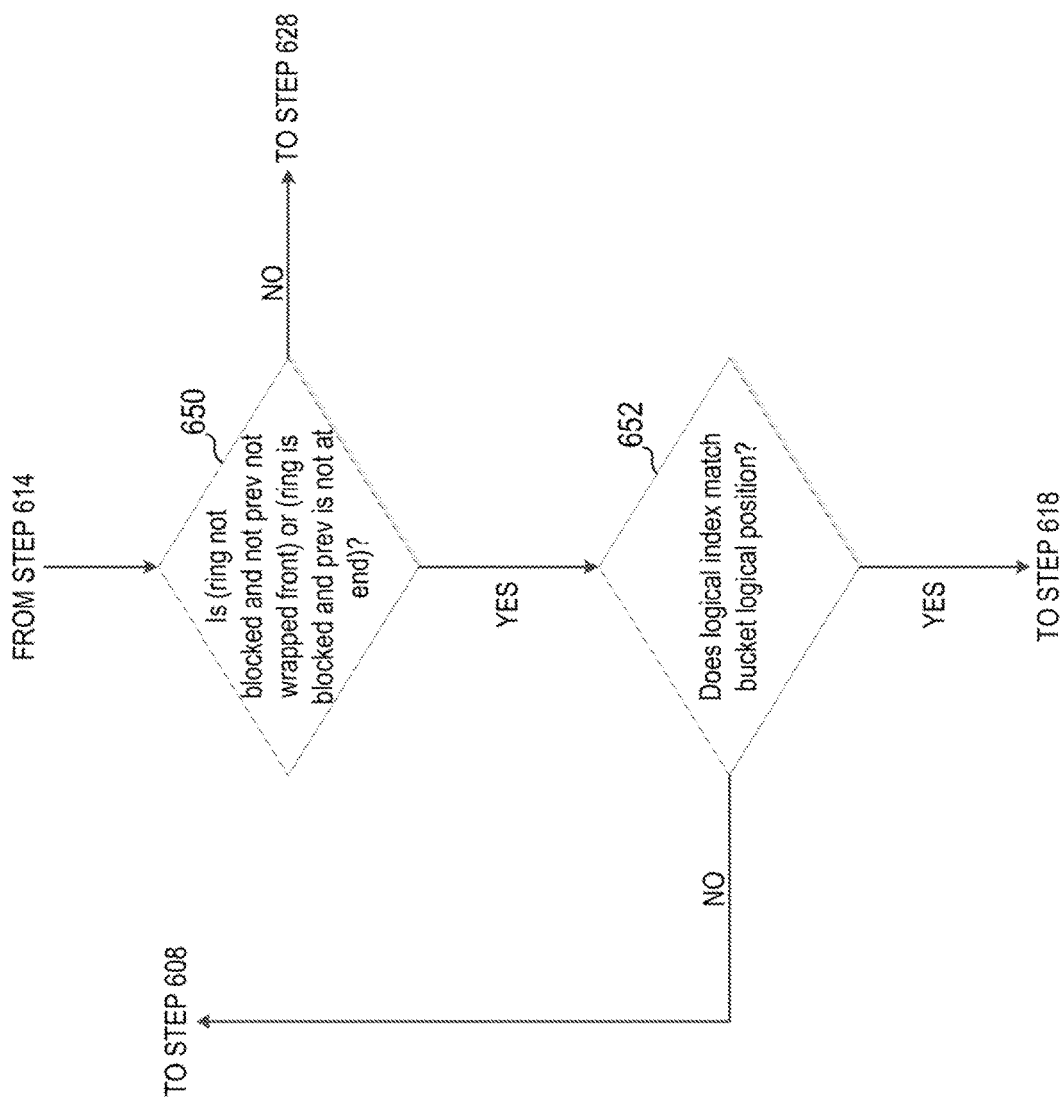

METHOD AND SYSTEM FOR QUEUING DATA FOR MULTIPLE READERS AND WRITERS

BACKGROUND

Concurrent computing environments use ever more powerful and complex multicore and/or multi-CPU platforms, with highly multithreaded operations. Especially where multiple and simultaneous producers (e.g., writers) and consumers (e.g., readers) operate on a given memory structure, this heightens the risk of process and/or thread contention, latency, and inefficient memory usage. As a result, concurrent computing can be associated with significant performance constraints. Such constraints can slow current processes and impose an opportunity cost of foregone added ones.

Mechanisms have been designed to address these constraints. These include locking mechanisms that can selectively brake producers so that consumers can "catch up." Disadvantages of locking mechanisms are known and can include significant wait times, thread stalls or thread death, and limited scalability. A lock-free mechanism, however, presents challenges as well, including the A-B-A problem, where state can appear identical from a first read to a second read, but in fact a separate process has "secretly" modified shared memory before changing it back again.

BRIEF DESCRIPTION OF DRAWINGS

FIG. 2 illustrates an example ring buffer in accord with various embodiments.

FIGS. 4A-4E illustrate an example scenario whereby the size of a ring buffer is adjusted.

FIG. 6C is an alternate embodiment relating to a dequeuing operation.

DETAILED DESCRIPTION

In the following description, reference is made to the accompanying drawings which illustrate several embodiments of the present invention. It is understood that other embodiments may be utilized, and mechanical, compositional, structural, electrical and other operational changes may be made without departing from the spirit and scope of the present disclosure. The following detailed description is not to be taken in a limiting sense, and the scope of the embodiments of the present invention is defined only by the claims of the issued patent.

Figure 1:
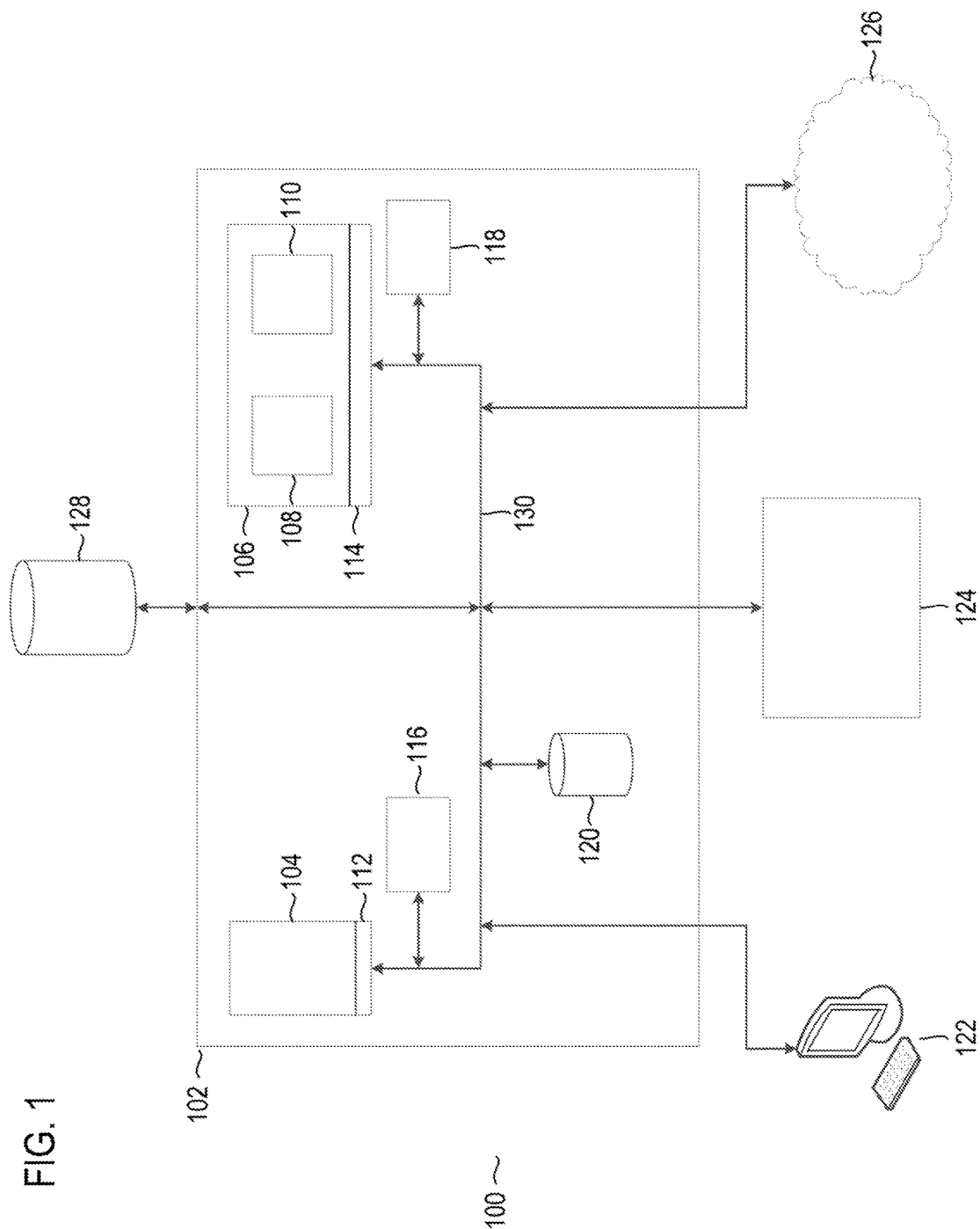
FIG. 1 illustrates an example computing environment in accord with embodiments.

FIG. 1 depicts an example architecture in accord with embodiments. System 100 comprises computing functionality, both local and distributed. System 100 may have a unit 102 comprising one, two or more central processing units 104,106, which can be considered processors. Unit 102 can be a server or servers. A processor can be single-core 104, or have multiple cores 108, 110 where more than one processor can be placed on a "chip". The processor 104, 106 can execute instructions by many techniques, in concurrent processes and threads. Many variations of multiprocessor and/or multicore systems can be used. There may be multiple memory components. Certain memory components can be considered main memory 120, which may be shared among one or more processors 104, 106. Other memory components can be considered cache memory 112, 114, 116, 118, which may be more closely associated with a specific processor 104, 106. Caches can be divided into levels, e.g., L1 cache 112, 114, L2 cache 116, 118, and more. A bus 130 or other interconnection functionality can permit communication within and beyond a system. An additional unit 124 with comparable functionality can be in operative communication with a first unit 102. There can be display and input/output functionality 122. Also, a network or networks 126 can be present. Additionally, outside memory 128 or memories can be utilized. It will be readily appreciated that many interoperative variations, configurations, and architectures can be employed in accord with embodiments disclosed herein.

In FIG. 2, an example ring buffer 200 is depicted in accord with embodiments. A ring buffer can be a data structure associated with and/or stored by one or more memory components. Ring buffer 200 can have attributes including a header 210 associated with at least one or more buckets 212, 214, 216, 218, 220 in an array. Each bucket can be considered an element of such array. By way of non-limiting example, ring buffer 200 can have a capacity of 32 buckets. Buckets 214, 216 and 218 represent single buckets. Buckets 212 and 220 represent multiple buckets. Header 210 contains fields that among other functions can manage reading and writing. Such fields can include next 240, front 241, padding1 242, back 243, end 244, padding2 248, capacity 250, and mask 252.

An item 230 can be placed in ring buffer 200. The item can be a pointer to a memory structure; it can also be the item itself rather than a pointer. In addition, a position variable 232 can track the logical position of such item. Main variables that are modified by enqueue and dequeue operations in the header 210 can be defined such that they will occur in separate cache lines, helping to minimize contention among threads and allow operations to occur in parallel without cache lines being invalidated by updates in another thread. Counts can be used to track logical positions in queue operations and to know if the ring in question is empty.

The struct configuration can be defined to facilitate implementing various embodiments. However, added configurations can be used such as classes, or other method of allocating compound structures.

As seen in FIG. 2, in ring buffer 200 a front 241 field references the position at which the last item was written, while the back 243 field references the next field that can be read. When front and back are equal, the buffer can be considered empty. As front 241 field reaches the end of the ring buffer it continues to be incremented, but a power of 2 modulo operation can be performed on the incremented front value before accessing the ring so that the ring logically wraps. A modulo for a size that is a power of 2 can be performed by an AND operation with a mask that is produced by subtracting 1 from the size; however, other multiples or powers can be used in connection with performing a modulo operation.

In other words, the position value stored in each bucket can represent a logical position based on continued wrapping of the ring. When front 241 logically wraps to the point that it collides with back 243, a new and larger ring can be created. New writes to the queue can occur in the new ring while reading can continue in the original ring. This can continue until the ring is empty, at which point the reads can advance to the new ring also.

Figure 3:
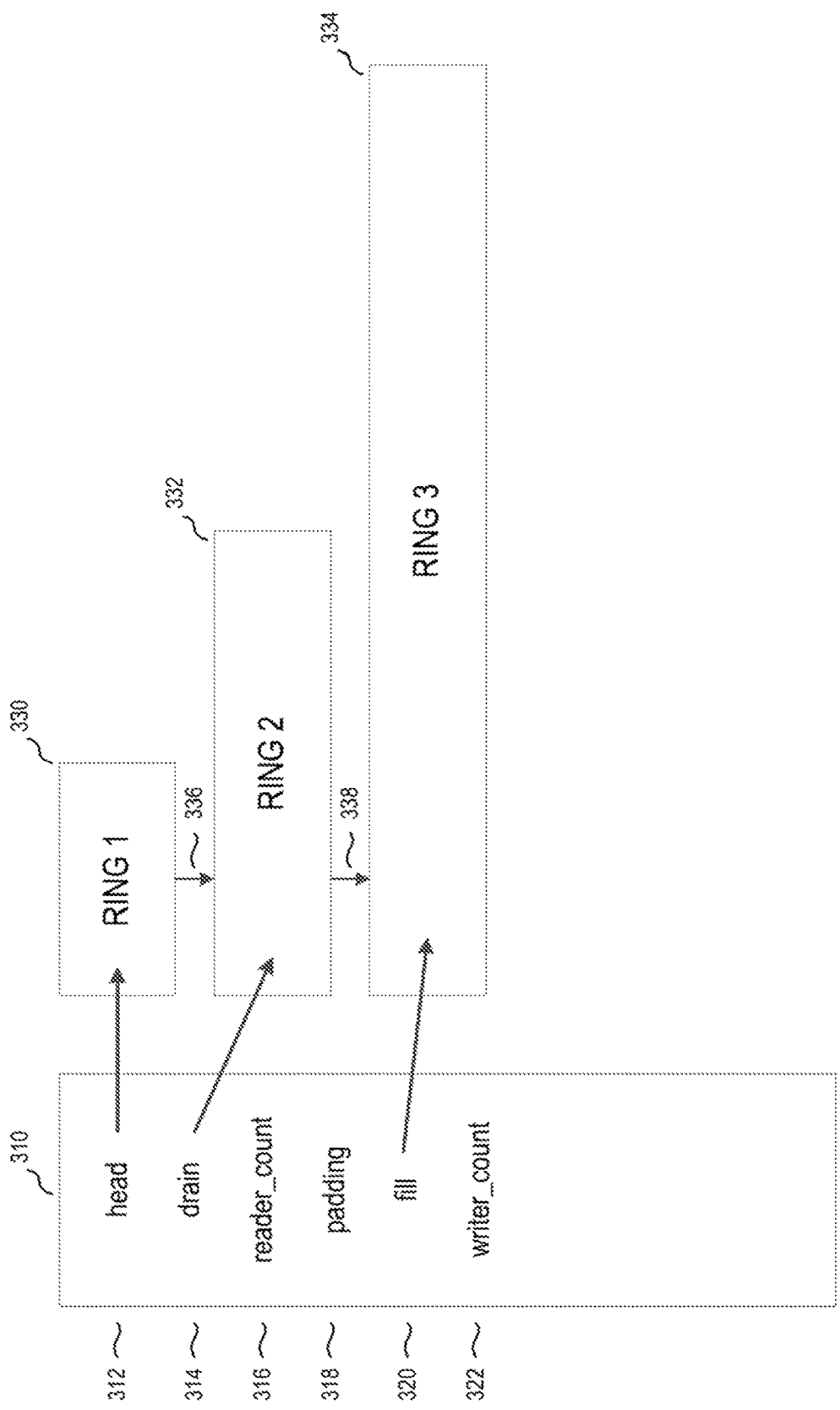
FIG. 3 illustrates an example queue and three example ring buffers in accord with various embodiments.

In embodiments, as depicted in FIG. 3, queue 310 can be utilized. Queue 310 can have a reader portion and writer portion aligned to be in separate cache lines. The reader portion can have two pointers to ring structures and a reader_count 316 that acts as a reference count of reader processes. Head 312 pointer can point to the first ring in a linked list of rings 330, 332, 334, and drain pointer 314 can point to the ring currently being drained of items. The writer portion of the queue can have a fill 320 pointer to the ring currently being filled and a writer count that is a reference count of active writer processes. The writer_count 322 and reader_count 316 variables can act as reference counts of accessing processes and allow the system safely to release memory of rings that are no longer referenced. In addition, padding 318 can be used to reduce the possibility of conflict due to cache line sharing. Next field pointers 336 and 338 are depicted.

Initial queue initialization and ring allocation can be performed. Initializing can comprise zeroing reader and writer counts, allocating the initial ring (with an example length of 32), and setting the end 244 field to an obviously invalid value that will not be matched by the back 243 field until it is reset. The number of buckets in the ring can be an integer that is a power of two and can be obtained by doubling the previous ring size to allow for efficient modulo operations that map the logical position to the actual array index.

Figure 4A:
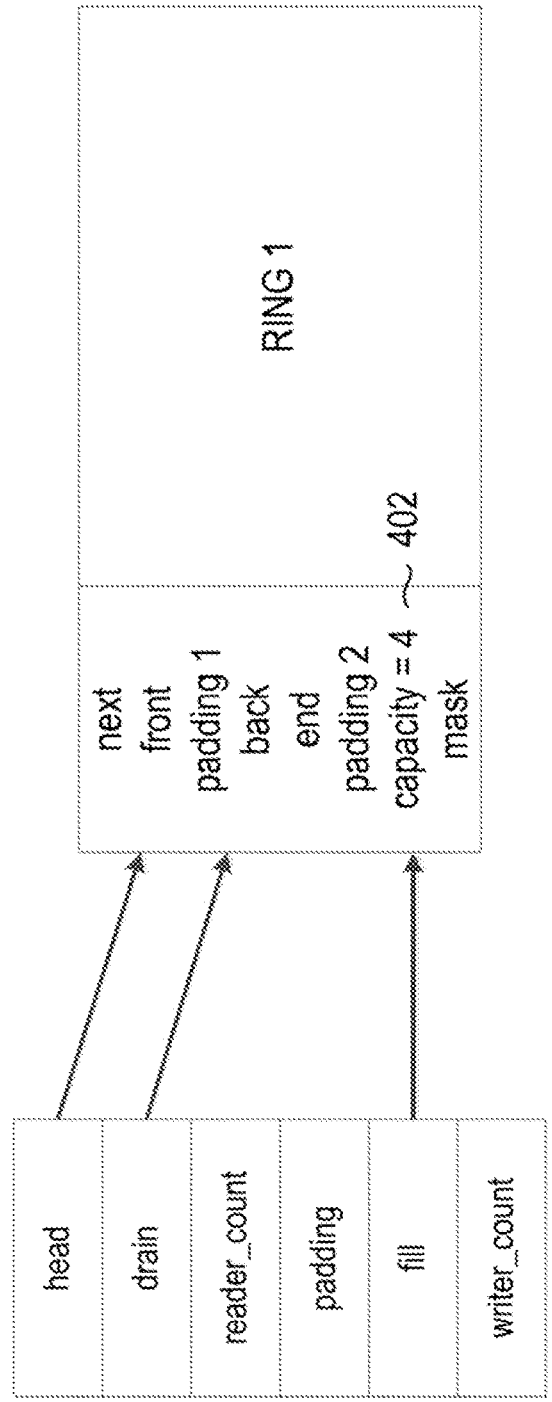
Figure 4C:
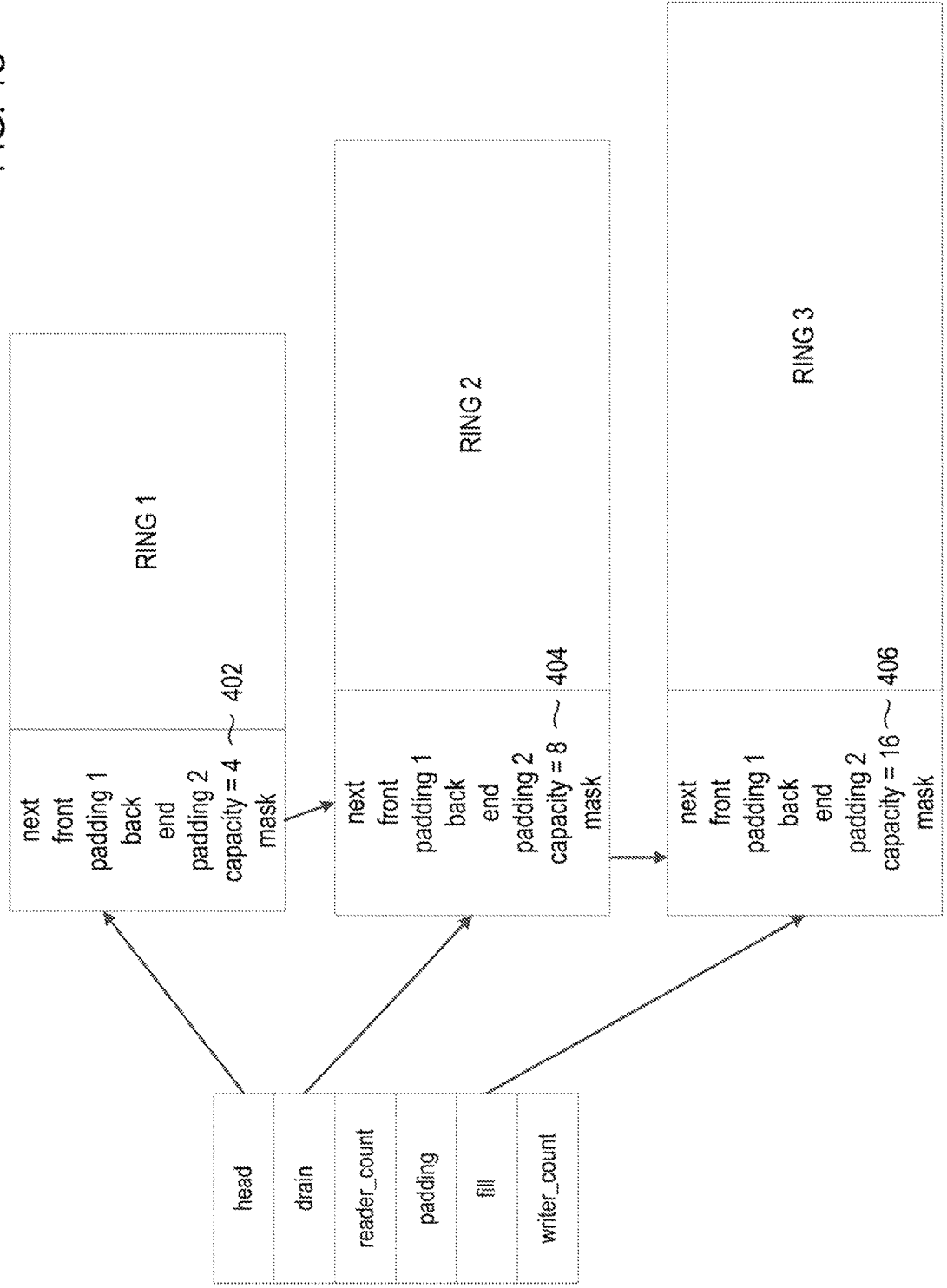
Figure 4D:
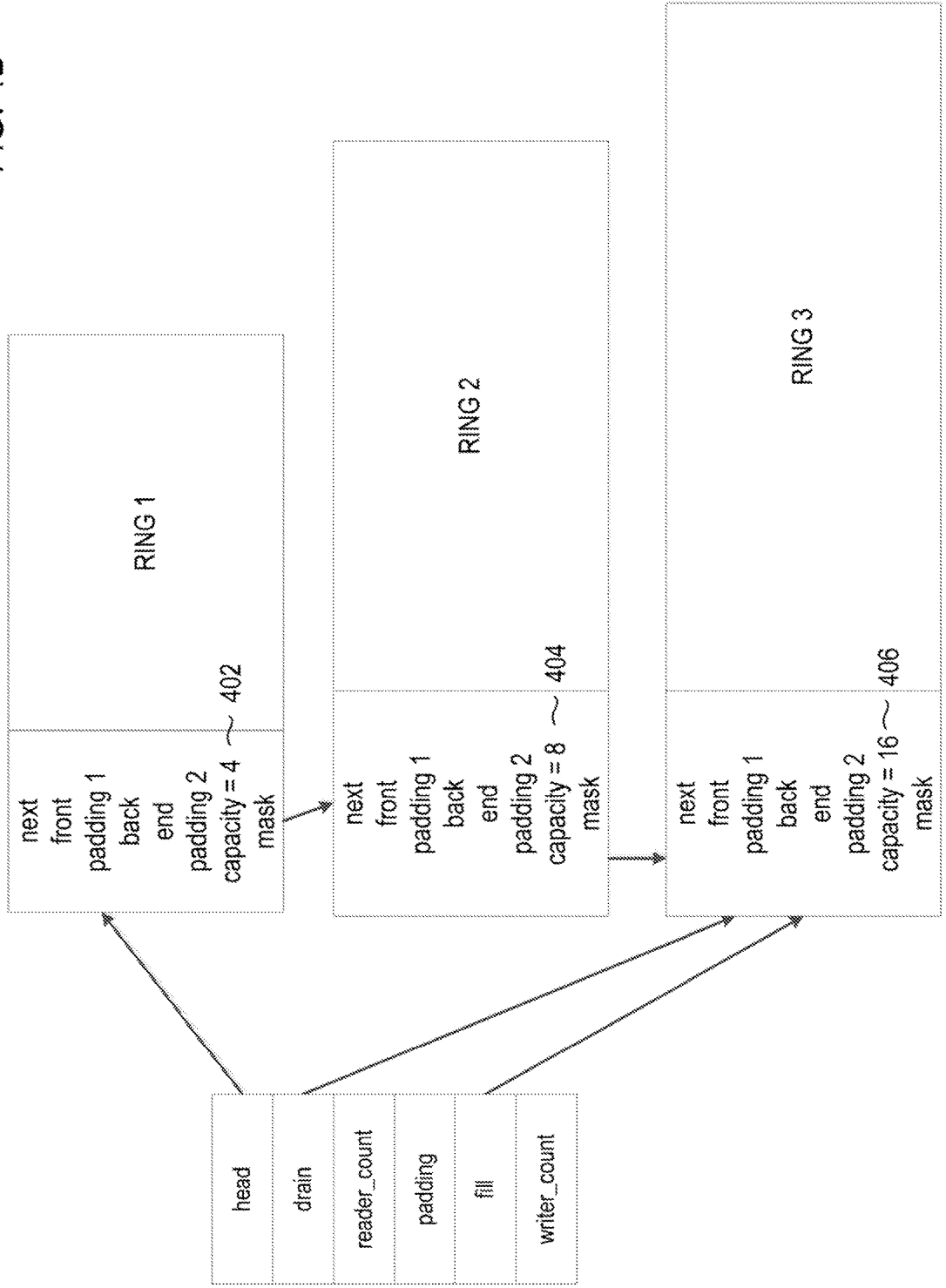
Figure 4E:
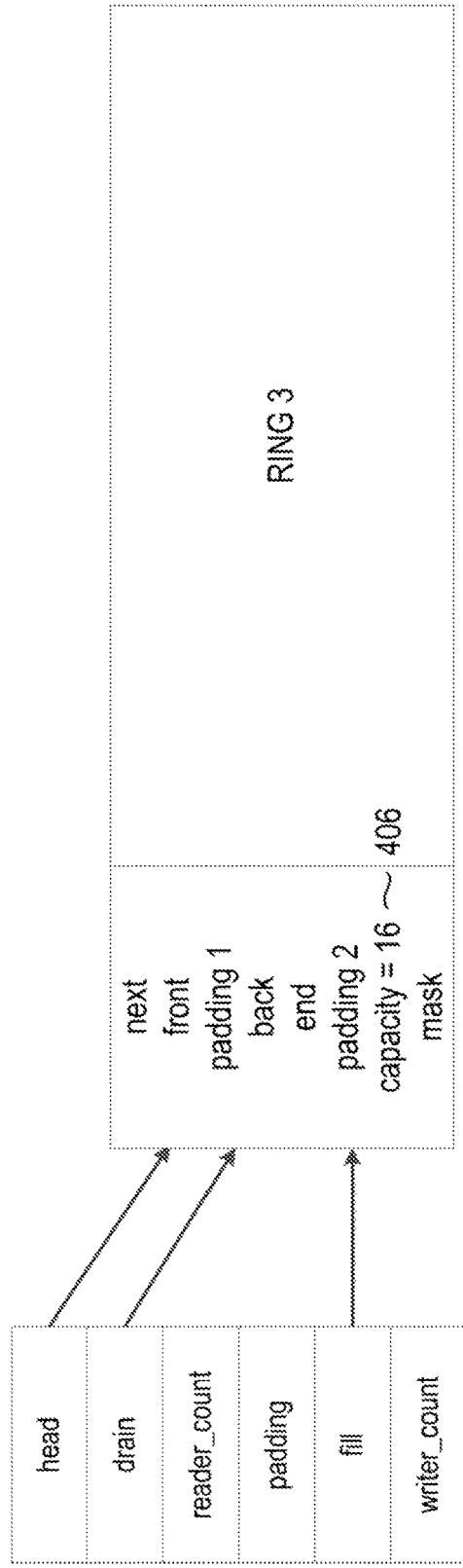

FIGS. 4A-4E depicts a sequence of state changes illustrating a relationship between a queue and associated ring buffer(s), and more specifically how added ring buffers can be declared and utilized upon detection of a potential overflow condition and how pointers in a queue can adjust accordingly. FIG. 4A depicts an example state upon initialization. By way of non-limiting example, capacity in ring 1 is set to 4. FIG. 4B depicts an example state upon detection of a first overflow. It will be noted that capacity of ring 1 is 4, and ring 2 is 8, in accord with embodiments where the newly allocated ring has double the capacity. FIG. 4C depicts an example state where the first overflow buffer is draining and a second overflow buffer is filling. It will be noted that capacity of ring 1 is 4, ring 2 is 8, and ring 3 is 16. FIG. 4D depicts an example where a second overflow buffer is filling, and draining. FIG. 4E depicts an example state where a second overflow buffer is filling and draining, and previous ring buffers have been released.

An enqueue operation can be performed, which employs previously discussed data structures. Conceptually, the buffer can be treated as if it were infinitely long, and the system can use a modulo operation to map onto actual ring size. To make the modulo operation even more efficient, ring size can be a value of the power of two, so that an AND operation with a mask can produce an index within range of the ring size. The enqueue operation can use three atomic non-blocking operations: atomic_fetch_and_add (AFA), atomic_fetch_and_subtract (AFS), and compare_and_swap (CAS). The AFA and AFS operations can return the value of the integer field before the update occurs. An atomic increment of the writer reference count and atomic decrement can be performed. A modulo operation can map the logical position to the actual index into the ring using the mask to point to the current bucket in the ring. The CAS operation can advance the ring front 241 value.

The enqueue operation can declare certain variables including index, prey, and success. These variables can comprise local fields that hold fixed copies of their respectively named fields, which can change at any moment due to other writers' changing them. The local fields are used to "fix" a value in time that will not change in order to compare against another changing field. Also, an INTEGER_MAX can be declared which is the maximum integral value for the size of an integer field.

Figure 5A:
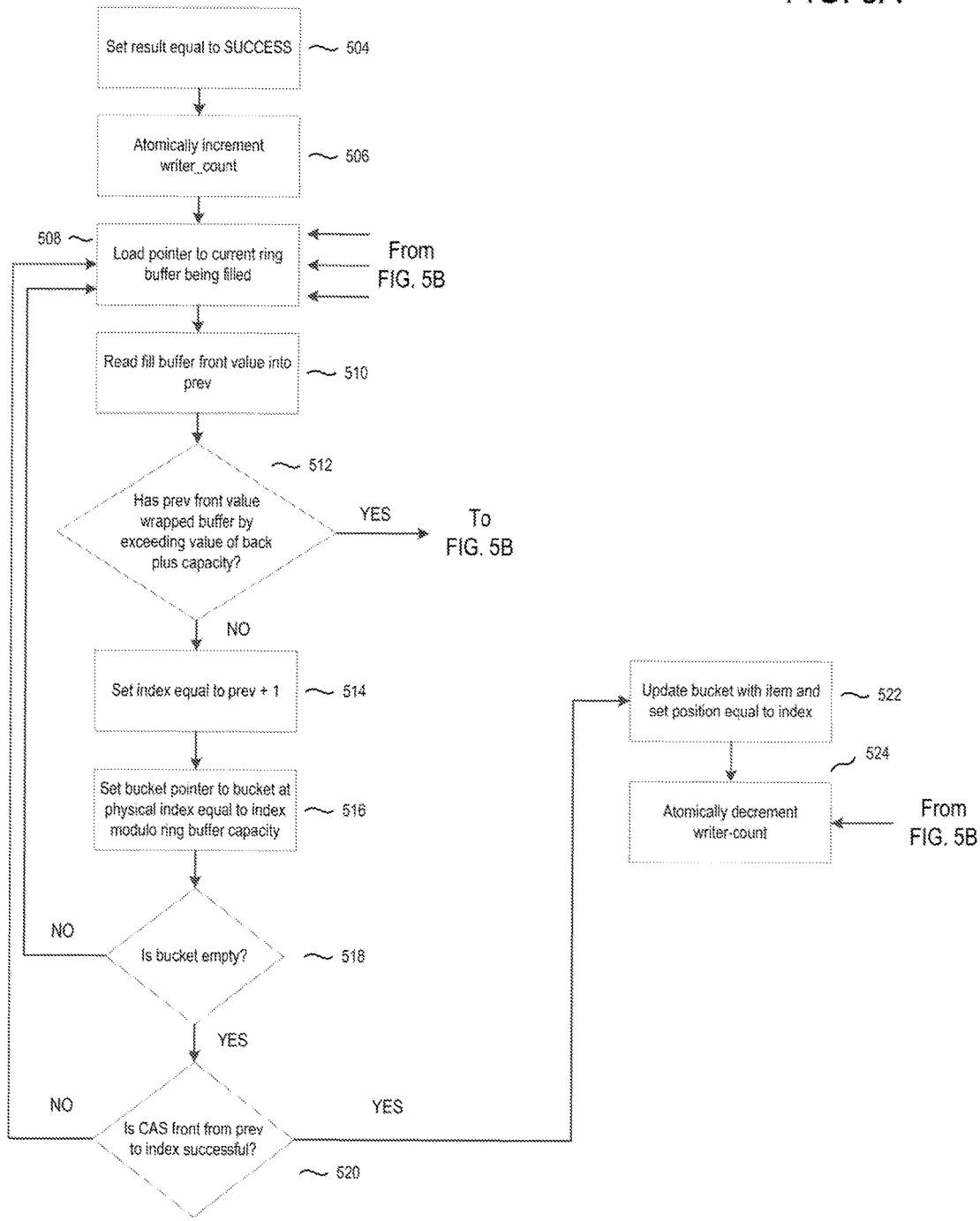
FIGS. 5A and 5B are example flowcharts related to an enqueuing operation providing writing functionality in connection with a ring buffer.
Figure 5B:
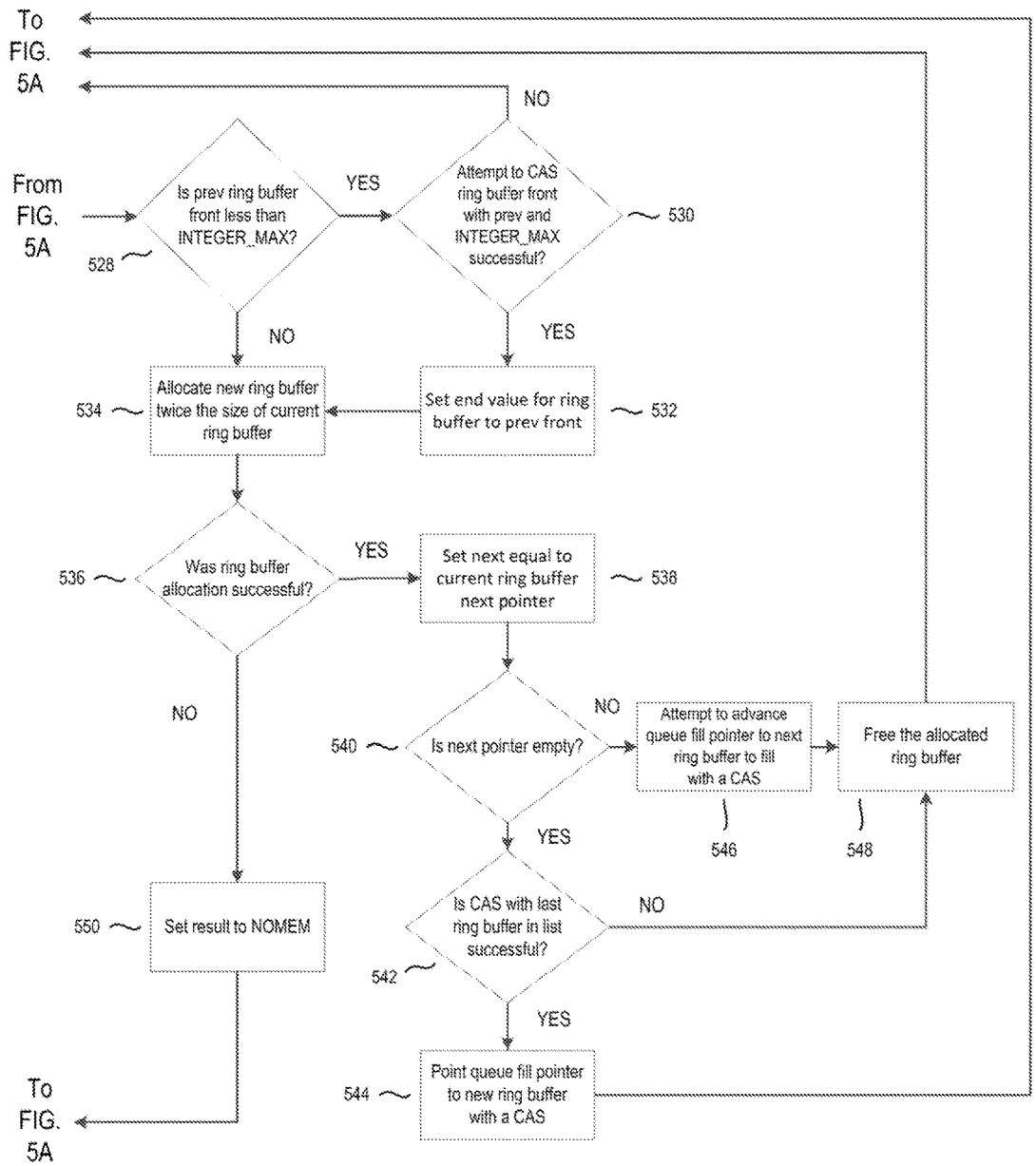

In accord with embodiments, FIGS. 5A and 5B show how the current fill ring can be added to, and how the system can dynamically adjust utilizing a logical perspective if the ring buffer—which has a finite number of buckets from a physical perspective—becomes full. A result can be set equal to SUCCESS 504. The writer_count is atomically incremented 506. A pointer to the current ring buffer being filled is loaded 508. The fill buffer front value is read into prey 510. It is clear that if buckets become progressively filled then, given the circular nature of the data structure, physical overflow is possible unless measures are taken. Accordingly, a determination can be performed 512 to establish whether the prey front value has wrapped the buffer by exceeding the value of back plus capacity, i.e., the buffer is full. In other words, a check is made whether it is acceptable to keep writing to the current ring buffer.

If the result of this determination 512 is negative, the index can be set equal to prey+1 at 514, which advances index to the next position. The bucket pointer is set to the bucket at the physical index equal to index modulo ring buffer capacity 516. The modulo operation can be done via use of a mask (using an AND operation if the size of the ring buffer is a power of 2). It is then tested whether the bucket is empty 518. If the bucket is not empty, control passes back to step 508 where a pointer is loaded to the current ring buffer being filled. If the bucket is empty, then a CAS swap front from prey to index is done and a determination is made whether this operation is successful 520. If successful, the bucket is updated with the item and position is set equal to index 522, and the writer_counter is atomically decremented 524 such as by an AFS; if unsuccessful, control passes back to step 508 where a pointer is loaded to the current ring buffer being filled. In this way items can be added to the ring buffer.

However, the determination in step 512 can return a positive result. This will be so where the logical position of the ring has been advanced to such an extent as to comprise a potential overflow condition. Put simply, the ring has "wrapped." Accordingly, measures are taken to permit continued efficient non-locked operations, including by declaring a second, expanded ring buffer.

Accordingly, once it has been detected that the buffer has wrapped 512, it is determined whether prey ring buffer front is less than INTEGER_MAX 528, indicating that it is blocked from further writing. A rationale is to attempt to block processes from adding to the ring (though it is still possible). If the answer at step 528 is yes, an attempt is made to CAS ring buffer front with prey 530. This check attempts to block further writing to the ring buffer by other processes. If the attempt in 530 is not successful, control returns to step 508; if it is successful, the end value is set for ring buffer to prey front 532 (setting this value lets dequeue processes know when the ring buffer is empty). Now, a new ring buffer is allocated twice the size (or any size that is larger than the current size) of the current ring buffer 534. And, if the answer is no at step 528, control passes such that a new ring buffer is allocated twice the size (or any size that is larger than the current size) of the current ring buffer 534.

A second, expanded ring has now been allocated. This functionality can be extended upon further iterations through the procedure such that multiple rings can be dynamically allocated as needed, each double the size of the prior one (or any size that is larger than the prior one).

It is tested whether the ring buffer allocation was successful 536. If yes, next is set equal to current ring buffer next pointer 538, and it is determined if next pointer in the ring buffer is empty 540. If no, an attempt is made to advance queue fill pointer to next ring buffer to fill with a CAS 546, and the allocated ring buffer can be freed 548. If the answer in step 540 is yes, however, it is determined whether a CAS with the last ring buffer in the list is successful 542. If no, the allocated ring buffer can be freed 548; if yes, the queue fill pointer can be pointed to the new ring buffer with a CAS.

Returning to step 536, where it was determined if the ring buffer allocation 536 was successful, if the answer is no, the result can be set to NOMEM indicating out of memory, and writer_count can be atomically decremented 524. It should be appreciated that some operating systems will simply kill the process if memory allocation cannot be fulfilled, rendering this step moot.

Accordingly, a new ring can be allocated with capacity larger than and/or a multiple of the current ring, and the new ring can be added to the end of a linked list.

Besides enqueue operations disclosed above, reading functionality can be performed via a dequeue operation disclosed in embodiments below.

Figure 6A:
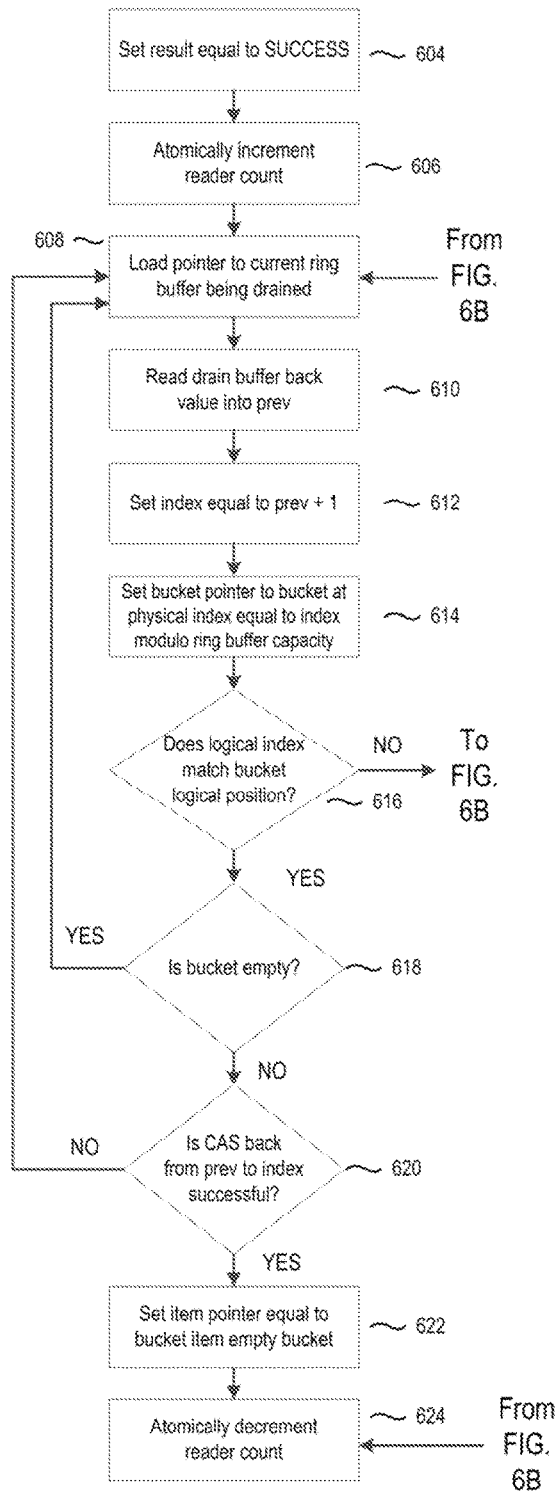
FIGS. 6A and 6B are example flowcharts related to a dequeuing operation providing reading functionality in connection with a ring buffer.

In FIG. 6A, a result can be set equal to SUCCESS 604. The reader count can be atomically incremented 606. A pointer can then be loaded to the current ring buffer being drained 608.

The drain buffer back value is read into prev 610, and an index set equal to prev+1 at step 612. The bucket pointer is set to a bucket at physical index equal to index modulo ring buffer capacity 614. Again, this can be accomplished by a modulo operation using a mask and ANDing as appropriate. At this point, it can be determined whether the logical index matches bucket logical position 616. In other words, it can be determined if the logical position of the item in the current bucket matches the current back of the ring counter—again, put simply, it is determined whether the ring has wrapped.

Figure 6B:
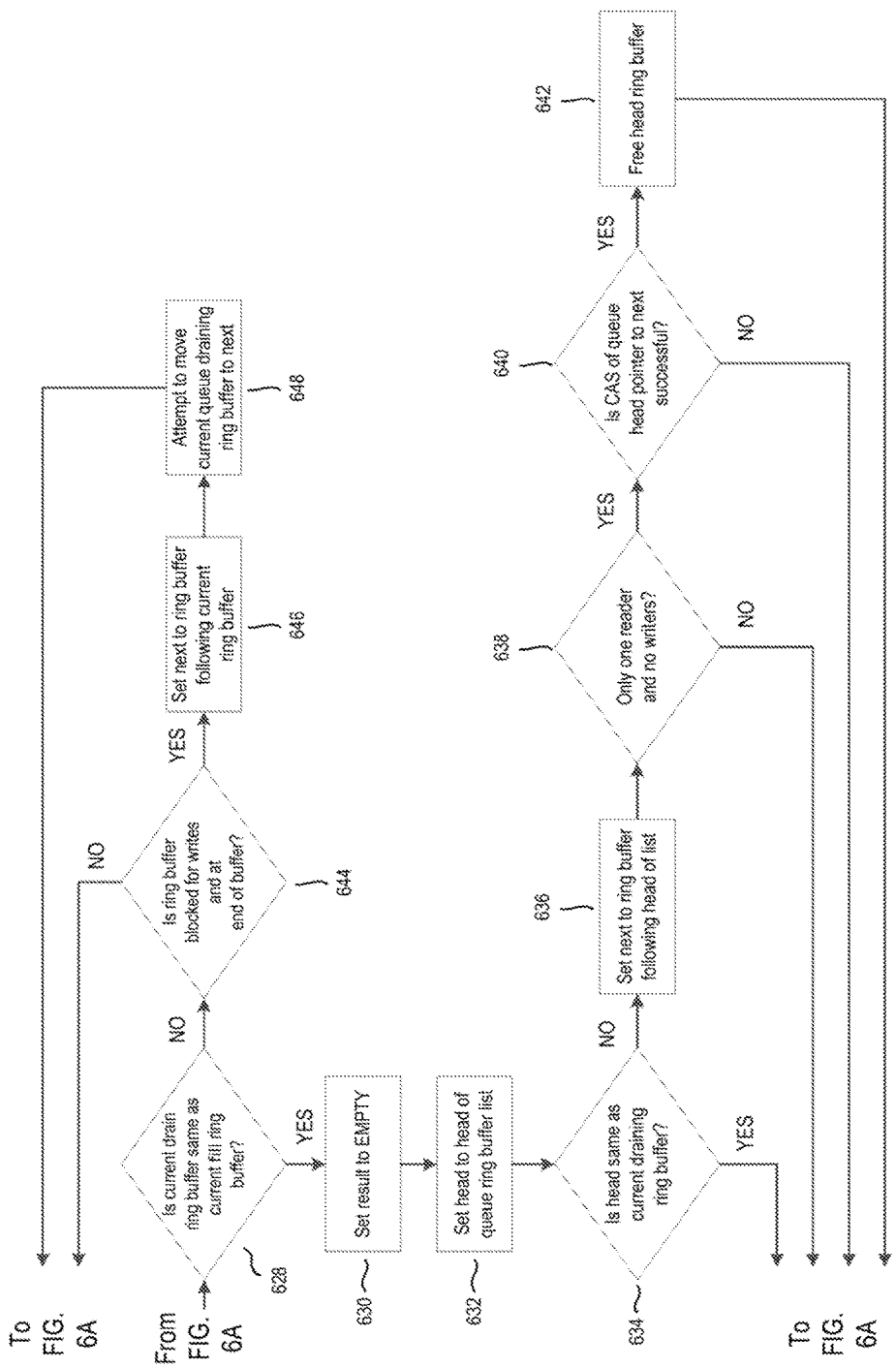

If the answer at step 616 is yes, it is then determined whether the bucket is empty 618. If the bucket is empty, control passes to step 608. If the bucket is not empty, it is determined whether the CAS back from prev to index was successful. If no, control passes to step 608; if yes, item pointer is set equal to bucket item empty bucket 622. For context, it is possible for a writer to be in the actual process of writing to a bucket while a reader is attempting to access the very same bucket. By checking that both the position matches and that the item is present, the reader knows that the writer has completed the full write operation. On some systems, with a conservative memory update policy, the position check only might be appropriate; however, on other systems with a more relaxed memory update policy, updates can be seen to occur out of order. For these reasons, both can be checked. Then, reader_count is atomically decremented 624. If the answer at step 616 is no, as seen in FIG. 6B. it is determined whether the current drain ring buffer is the same as the current fill ring buffer 628.

If the answer at step 628 is no, it is determined whether the ring buffer is blocked for writes and at end of buffer 644, and if the answer is no, control passes back to step 608. If the answer is yes, then next is set to the ring buffer following the current ring buffer 646, an attempt is made to move the current queue draining buffer to next 648, and control passes back to step 608. It will be appreciated that one purpose of step 644 is to use values in enqueue operations to establish if it is acceptable to start draining the next ring buffer.

If the answer at step 628 is yes, then result is set to EMPTY 630, and head is set to head of queue ring buffer list 632. It is then determined whether head is the same as current draining ring buffer 634. If yes, reader_count is atomically decremented 624. If no, next is set to ring buffer following head of list 636. It will be appreciated that one purpose of step 628 is to check whether the ring buffer is empty before attempting to advance.

It is then determined if there is only one reader, and no writers 638. If no, control passes to step 624 and reader_count is atomically decremented.

If, however, it is determined that there is only one reader and no writers at step 638, this is a condition that can indicate it may be permissible to free memory safely. Put another way, the check can establish that the head ring buffer can be released as no other process references the memory.

Accordingly, if there is only one reader and no writers 638, it is determined whether a CAS of queue head pointer to next is successful 640. If successful, the head ring buffer can be freed 642, and control again can pass to step 624 where reader_count is atomically decremented.

Certain programming languages, such as Java or C#, can support memory deallocation on a largely routine basis. Thus, to the extent deallocation operations are carried out on a systematic basis such as with Java, C#, or other language, in embodiments it is possible that specific calculation of the quantity of readers and/or writers may be adjusted to account for this type of "garbage collection", potentially rendering this step unneeded. In addition, for the above reasons, freeing the buffer in step 548 may not be needed in embodiments. Certain other languages, such as C, C++, or other language may not currently support this functionality on a largely routine basis, and may require manual memory management to a lesser or greater degree.

FIG. 6C discloses an added embodiment relating to dequeue operations. In this embodiment it is determined whether the ring buffer is empty by checking fields in the parent queue structure only without having directly to access the next logical bucket in ring buffer memory. It permits determination of whether a ring is not blocked and not wrapped, or not at an end. The process in in FIG. 6C is considered to continue from FIG. 6A, as illustrated. In step 650, it is determined whether the ring is not blocked and not prev not wrapped front, or ring is blocked and prev is not at end. If the answer is yes, it is determined whether the logical index matches the bucket logical position 652: if no, control returns to step 608, and if yes, control passes to step 618. If, however, the answer at step 650 is no, control passes to step 628. Subject to the foregoing, and the steps depicted in FIG. 6C, the remainder of steps in FIGS. 6A and 6B are considered to apply.

While the invention has been described in terms of particular embodiments and illustrative figures, those of ordinary skill in the art will recognize that the invention is not limited to the embodiments or figures described.

Some portions of the detailed description are presented in terms of procedures, steps, logic blocks, processing other symbolic representations of operations on data bits that can be performed on computer memory. Certain steps may be performed by some or all of hardware, software, firmware, or combinations thereof.

The program logic described indicates certain events occurring in a certain order. Those of ordinary skill in the art will recognize that the ordering of certain programming steps or program flow may be modified without affecting the overall operation performed by the preferred embodiment logic, and such modifications are in accordance with the various embodiments of the invention. Additionally, certain of the steps may be performed concurrently in a parallel process, as well as performed sequentially.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A computer-implemented method of allocating a ring buffer, the method comprising:
    sequentially storing data with a first set of values in a first ring buffer comprising x elements, wherein x is a positive integer greater than two;
    determining that the first ring buffer is full because a first element of the first ring buffer and a last element of the first ring buffer have wrapped upon each other;
    allocating a second ring buffer, wherein the second ring buffer contains at least x+1 elements; and
    sequentially storing data with a second set of values in one or more elements of the second ring buffer, wherein write operations are performed on elements of the second ring buffer because the last element of the first ring buffer is occupied by a value, and wherein reading operations are performed on the first set of values in the first ring buffer concurrently with or subsequently to the write operations being performed on the second set of values in the ring buffer.

2. The method of claim 1, wherein, provided that x>3, the second ring buffer contains a quantity of elements equal to x times y, wherein y=2 or a positive multiple of 2.

3. The method of claim 1, wherein added write operations are blocked to the first ring buffer.

4. The method of claim 1, wherein a fill pointer in a queue is directed from the first ring buffer to the second ring buffer.

5. The method of claim 1, wherein a current element is determined by performing a modulo operation wherein the numerator is derived from a value in an index field and the divisor equals x.

6. The method of claim 5, wherein the current element represents a logical position corresponding to a value in an index field.

7. The method of claim 6, wherein the first ring buffer is determined to be in a wrapped condition upon detecting that a logical position of a current element maps to a physical position of an element in the first ring buffer that is already occupied by a value.

8. The method of claim 1, wherein the first ring buffer and second ring buffer are associated in a linked list data structure.

9. A computer-implemented method of deallocating a ring buffer, the method comprising:
    storing a queue comprising at least one pointer;
    sequentially storing data with a first set of values in a first ring buffer comprising x elements, wherein x is a positive integer greater than two;
    determining that the first ring buffer is full because a first element of the first ring buffer and a last element of the first ring buffer have wrapped upon each other;
    allocating a second ring buffer, wherein the second ring buffer contains at least x+1 elements; and
    sequentially storing data with a second set of values in one or more elements of the second ring buffer, wherein write operations are performed on an element of the second ring buffer because the last element of the first ring buffer is occupied by a value, and wherein reading operations are performed on the first set of values in the first ring buffer concurrently with or subsequently to the write operations being performed on the second set of values in the ring buffer;
    determining that the first ring buffer is empty based on a head pointer being associated with the first ring buffer, and a drain pointer being associated with the second ring buffer; and
    deallocating the first ring buffer.

10. The method of claim 9, wherein it is identified that there is one reader and no writer, and, in the computing environment being used, at least some manual memory management is required for handling deallocation of a ring buffer.

11. A computer-implemented method of deallocating a ring buffer, the method comprising:
    storing a first ring buffer having a plurality of elements;
    sequentially storing data with a first set of values in a first ring buffer comprising x elements, wherein x is a positive integer greater than two;
    determining that the first ring buffer is full because a first element of the first ring buffer and a last element of the first ring buffer have wrapped upon each other;
    allocating a second ring buffer, wherein the second ring buffer contains at least x+1 elements;
    sequentially storing data with a second set of values in one or more elements of the second ring buffer, wherein write operations are performed on elements of the second ring buffer because the last element of the first ring buffer is occupied by a value, and wherein reading operations are performed on the first set of values in the first ring buffer concurrently with or subsequently to the write operations being performed on the second set of values in the ring buffer;
    storing, in a local field, values corresponding to a current front element of the first ring buffer and an end element in the first ring buffer;
    determining that the first ring buffer is empty because the first ring buffer either:
    is not blocked and is not wrapped, or
    the first ring buffer is blocked and the value of the current front element is not in a position corresponding to the end element; and
    deallocating the first ring buffer.

12. A computer-implemented method of storing a queue, the queue associated with at least one ring buffer, the method comprising:
    storing at least one queue attribute that points to at least one attribute of a first ring buffer, wherein the at least one queue attribute includes one or more of:
    a head pointer,
    a drain pointer,
    a value corresponding to a quantity of readers, or
    a value corresponding to a quantity of writers;
    sequentially storing data with a first set of values in the first ring buffer; and sequentially storing data with a second set of values in one or more elements of a second ring buffer, wherein write operations are performed on elements of the second ring buffer because the last element of the first ring buffer is occupied by a value, and wherein reading operations are performed on the first set of values in the first ring buffer concurrently with or subsequently to the write operations being performed on the second set of values in the ring buffer.

13. The method of claim 12, wherein a second ring buffer is allocated in response to a determination that the first ring buffer is full, and a first queue attribute is caused to point to the first ring buffer and a second queue attribute is caused to point to the second ring buffer.

14. The method of claim 12, wherein in the computing environment being used at least some degree of manual memory management is required for handling deallocation of a ring buffer, and further wherein one pointer corresponds to a quantity of readers, and one pointer corresponds to a quantity of writers.

* * * * *